(12) United States Patent
Kim

(10) Patent No.: US 7,740,709 B2
(45) Date of Patent: Jun. 22, 2010

(54) APPARATUS FOR STRIPPING PHOTORESIST AND METHOD THEREOF

(75) Inventor: Tae Woon Kim, Kyongsangbuk-Do (KR)

(73) Assignee: LG Display Co., Ltd., Seoul (KR)

( * ) Notice: Subject to any disclaimer, the term of this patent is extended or adjusted under 35 U.S.C. 154(b) by 480 days.

(21) Appl. No.: 10/314,293

(22) Filed: Dec. 9, 2002

(65) Prior Publication Data
US 2003/0111098 A1 Jun. 19, 2003

(30) Foreign Application Priority Data
Dec. 18, 2001 (KR) .......................... 2001-0080781

(51) Int. Cl.
B08B 7/00 (2006.01)
B08B 3/00 (2006.01)
B08B 3/02 (2006.01)
B08B 3/04 (2006.01)

(52) U.S. Cl. ............... 134/38; 134/2; 134/10; 134/34; 134/40; 134/94.1; 134/99.1; 134/99.2

(58) Field of Classification Search ........ 134/2, 134/10, 34, 38, 40, 94.1, 95.3, 99.1, 99.2; 430/329
See application file for complete search history.

(56) References Cited
U.S. PATENT DOCUMENTS
3,880,685 A * 4/1975 Rehm et al. ............... 216/93
4,190,481 A * 2/1980 Goffredo ............... 156/345.15
5,246,023 A * 9/1993 Breunsbach et al. ...... 134/57 R
5,671,760 A * 9/1997 Nakagawa et al. ........ 134/56 R
6,302,600 B1 * 10/2001 Nagase et al. ............... 396/611
7,109,037 B2 * 9/2006 Nakagawa et al. ........... 436/39
2003/0073242 A1 * 4/2003 Kitchens et al. ............... 436/55

FOREIGN PATENT DOCUMENTS
JP 2001-332528 A 11/2001
KR 2000-0013481 U 7/2000
KR 2001-0055353 A 7/2001

* cited by examiner

Primary Examiner—Alexander Markoff
(74) Attorney, Agent, or Firm—Birch, Stewart, Kolasch & Birch, LLP (57) ABSTRACT

An apparatus for removing a photoresist from a substrate which includes a stripping bath chamber, a conveying unit conveying a substrate containing a photoresist through the stripping bath chamber, a photoresist stripper material supplying unit positioned to dispense the photoresist stripper material to the substrate while the substrate is disposed in the stripping bath chamber, an antifoaming agent supplying unit disposed in the stripping bath chamber dispensing an antifoaming agent toward the photoresist stripper material in the stripping bath chamber, an antifoaming agent storing unit communicating with the antifoaming agent supplying unit supplying the antifoaming agent thereto, and a stripper storing unit operatively connected to the stripper supplying unit supplying stored photoresist stripper material thereto.

19 Claims, 5 Drawing Sheets

APPARATUS FOR STRIPPING PHOTORESIST AND METHOD THEREOF

This nonprovisional application claims priority under 35 U.S.C. §119(a) on Patent Application No. 2001-0080781 filed in KOREA on Dec. 18, 2001, which is herein incorporated by reference.

BACKGROUND OF THE INVENTION

1. Field of the Invention

The present invention relates to a method and apparatus for stripping photoresist from a substrate.

2. Discussion of the Related Art

Generally, a liquid crystal display in flat display panels has the characteristics of low-voltage driving, low power consumption, full-color realization, lightness, compact size, and the like, thereby rendering it widely applicable to a mobile terminal, a notebook computer, a video appliance, and the like.

A liquid crystal display device is fabricated by bonding two substrates having a plurality of patterns formed thereon to confront each other while leaving a predetermined interval therebetween and injecting a liquid crystal material between the two substrates. In this case, a plurality of the patterns are formed by photolithography.

Photolithography is carried out in the following manner: First of all, a photoresist as a photo-reactive material is coated on a layer of a specific material formed on a substrate. The photoresist layer is covered with a mask having a predetermined pattern. Exposure is carried out on the photoresist through the patterned mask. The exposed photoresist transcribes the predetermined pattern of the mask by exposure, and is then developed into a photoresist pattern.

Subsequently, a layer of the specific material is patterned using the photoresist pattern as an etch mask. The photoresist pattern is then removed from the patterned layer of the specific material using a stripper. In this case, the process of removing the photoresist pattern from the layer of the specific material is called a stripping process.

Apparatus corresponding to a process of coating the photoresist on the layer of the specific material, an exposure process of the photoresist, a development process of the photoresist, an etch process of the layer of the specific material, and a stripping process of the photoresist, respectively are in-line.

Figure 1:
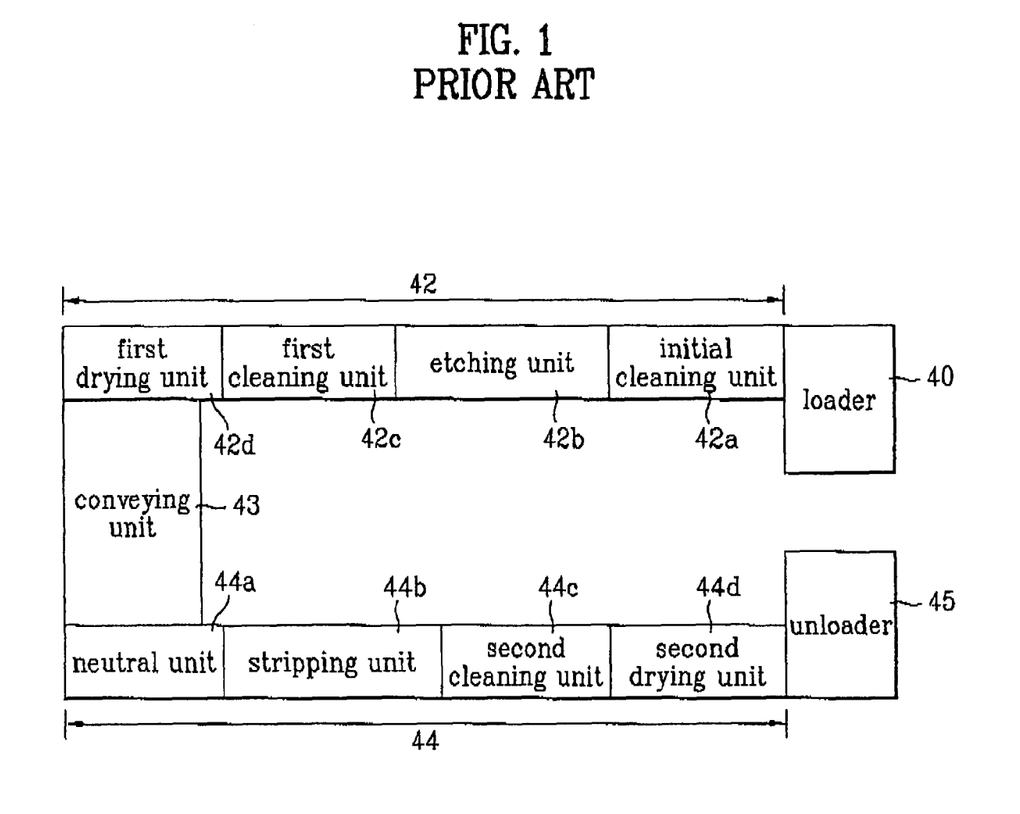
FIG. 1 illustrates a diagram of a related art system having etching and stripping modules for fabricating a liquid crystal display device.

FIG. 1 illustrates a diagram of an apparatus having etching and stripping modules 42 and 44 for fabricating a liquid crystal display device.

Referring to FIG. 1, the apparatus includes a loader 40 carrying a cassette (not shown in the drawing) containing a plurality of substrates therein for loading the carried substrate in the apparatus: an etching module 42 for etching the respective substrates loaded by the loader 40 with an etchant, a stripping module 44 for stripping the patterned photoresist coated on each of the substrates, which have been etched by the etching module 42, using a stripper, and an unloader 45 for unloading each of the substrates having the patterned photoresist stripped therefrom.

The substrates are conveyed to the unloader 45 from the loader 40 by a conveyer, a robot, or a conveying roller.

In this case, the etching module 42 includes an initial cleaning unit 42a for initially cleaning the loaded substrate, an etching unit 42b for spraying the etchant to etch the layer of specific material exposed between the patterned photoresist, a first cleaning unit 42c for spraying a cleaning agent to remove the reactants produced through the etching process by the etchant, and a first drying unit 42d for drying the cleaning agent.

The stripping module 44 includes a neutral unit 44a transferring the substrate loaded therein by a conveying unit 43 to the stripping module, a stripping unit 44b for removing the patterned photoresist remaining on the substrate, a second cleaning unit 44c for cleaning the substrate having the patterned photoresist stripped therefrom using de-ionized water, an organic solvent, or an inorganic solvent, and a second drying unit 44d for drying the cleaning agent.

The apparatus for stripping the patterned photoresist, as the stripping unit 44b, is explained as follows.

Figure 2:
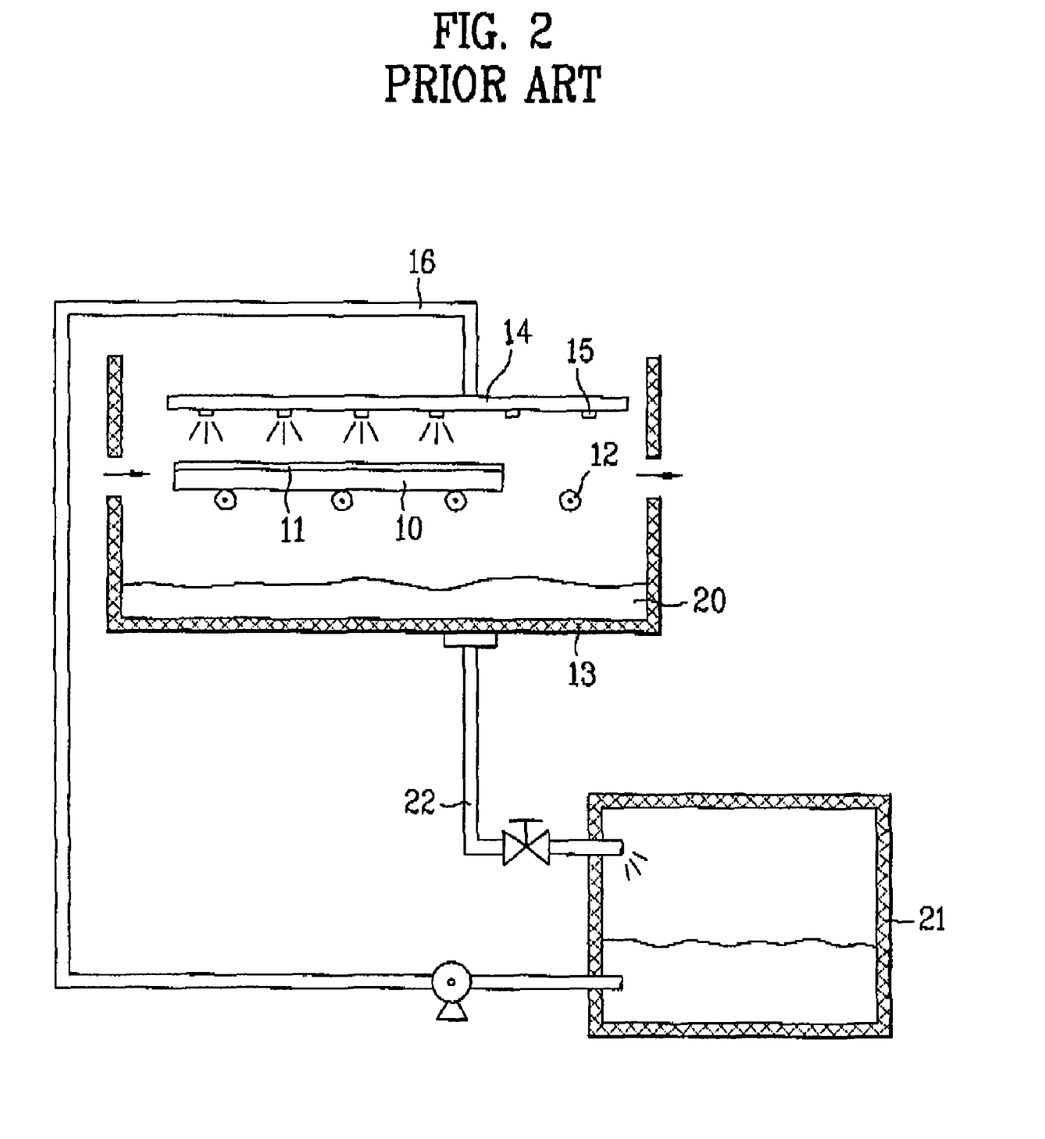
FIG. 2 illustrates a structural diagram of an apparatus for striping photoresist according to the related art.

FIG. 2 illustrates a structural diagram of an apparatus for striping photoresist according to a related art.

Referring to FIG. 2, an apparatus for stripping the photoresist according to related art includes a stripper supplying unit 14 containing a plurality of nozzles 15 for spraying the stripper, a conveying roller 12 installed under the stripper supplying unit 14 for conveying the substrate coated with the patterned photoresist 11 from one side to the other side, a bath 13 for collecting the stripper material through the stripping process, a stripper discharging pipe 22 for draining the stripper from the bath 13, a stripper storing unit 21 for maintaining the stripper drained through the stripper discharging pipe 22, and a stripper supplying pipe 16 installed between the stripper storing unit 21 and the stripper supplying unit 14 for supplying the stripper supplying unit 14 with the stripper material stored in the stripper storing unit 21.

In the apparatus for stripping the patterned photoresist according to the related art, once the substrate 10 is loaded in the bath 13 by a driving force of the conveying roller 12, the stripper supplying unit 14 sprays the stripper material on the substrate 10 to strip the patterned photoresist 11 coated on the substrate 10.

A method of fabricating a liquid crystal display device using the apparatus for striping a patterned photoresist according to related art is explained as follows.

FIGS. 3A to 3F illustrate cross-sectional views of a process for fabricating a liquid crystal display device using the method of related art.

Figure 3A:
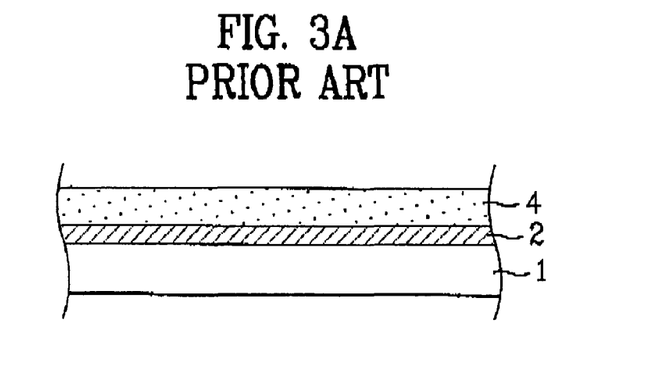
FIGS. 3A to 3F illustrate cross-sectional views of a process for fabricating a liquid crystal display device using the method according to related art.

Referring to FIG. 3A, a Cr layer 2 is formed with a thickness of 0.2 μm or less on a first substrate 1, and a photoresist 4 as a photo-reactive resin is coated uniformly on the Cr layer 2 by spinning or roll coating.

Figure 3B:
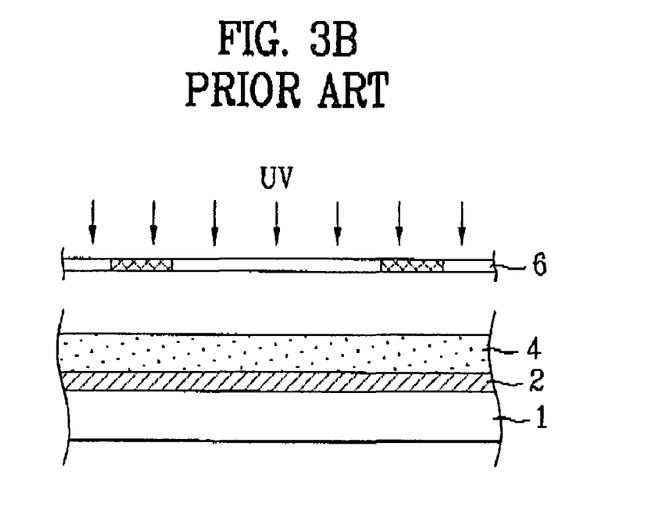

Referring to FIG. 3B, a photomask 6 having a predetermined pattern is disposed over the photoresist 4. Rays of, e.g., UV-rays in general, electron beams, or X-rays are then applied toward the substrate 1 from the upper side of the photomask 6 to depict a predetermined pattern of the photomask 6 on the photoresist 4. This process is called an exposure process.

Subsequently, the photoresist 4 after the exposure process, is exposed to a high temperature, and ions are implanted in the photoresist 4, or the photoresist 4 is hardened by UV-rays just to increase the anti-solubility of the patterned portion of the photoresist 4.

Figure 3C:
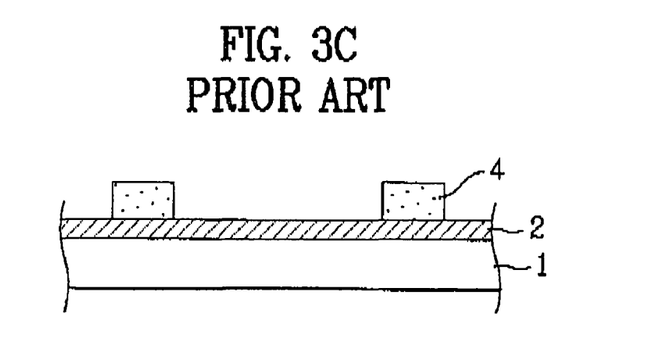

Referring to FIG. 3C, a process of developing the photoresist is carried out using a developing solution. The remaining portion of the exposed photoresist 4 except the patterned portion is then removed. The process of exposure and development is called a patterning process.

In the case that the photoresist 4 is positive, the portion of the photoresist 4 exposed to the rays is removed. If the photoresist 4 is negative, the portion of the photoresist 4 failing to be exposed to the rays is removed.

Figure 3D:
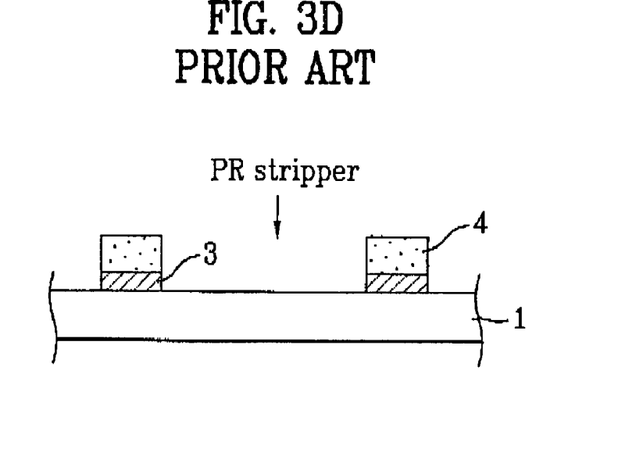

Referring to FIG. 3D, the Cr layer is etched by a specific etchant using the patterned photoresist 4 as an etch mask, to form a black matrix 3. In this case, such an etch process can be performed by a dry etch using plasma or a wet etch using a chemical solution.

The black matrix 3 is formed on a part from which current or light leaks, as well as a part failing to control liquid crystal alignment, such as a portion of disclination to cut off light leakage.

Figure 3E:
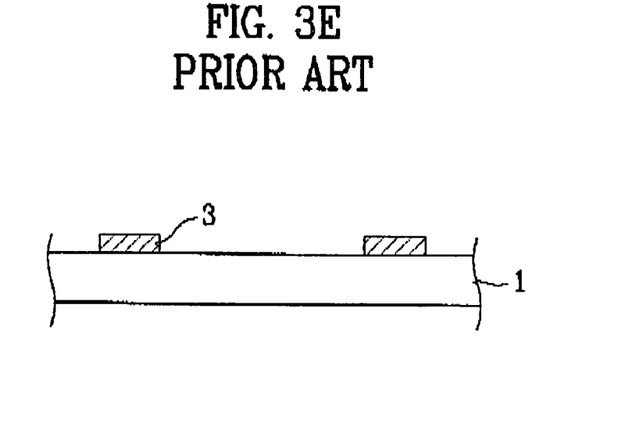

Thereafter, the patterned photoresist is completely removed using the stripper, whereby the patterned black matrix 3 remains on the first substrate 1 as illustrated in FIG. 3E.

In this case, the stripper for the patterned photoresist 4 is an organic chemical compound mixed with additives such as NMP (N-methylpyrrolidone), MEA (monoethanolamine), BDG (butyldiglycol), carbitol{2-(2-ethoxyethoxy)ethanol}, a nonion based additive, a fluorocarbon based additive, a silicon based additive, and the like.

In this case, the MEA breaks the cross-linking of the photoresist, the NMP swells the photoresist, the BDG wets the photoresist with a solution, and the carbitol or IPA helps the photoresist dissolve in a solution.

Subsequently, the substrate 1 is cleaned by an organic material in order to prevent corrosion of layers that will be formed later as well as to remove residue of the photoresist 4.

Figure 3F:
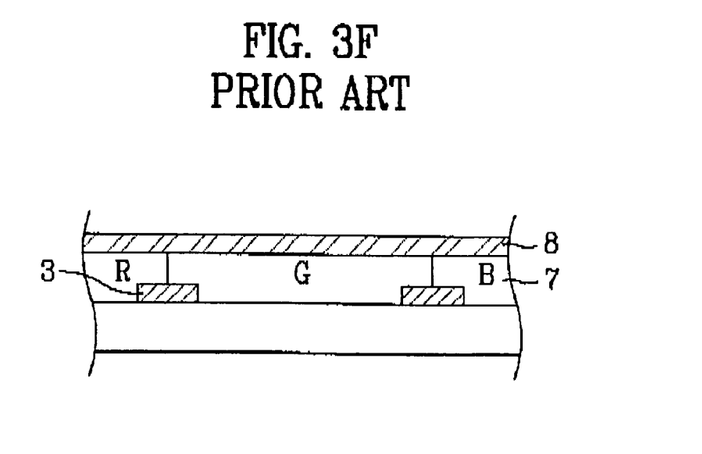

Referring to FIG. 3F, a color filter layer 7 is sequentially formed by sequentially coating a R-color resist, a G-color resist, and a B-color resist between the patterned black matrix 3. ITO (indium tin oxide) as a transparent conductive material and as a common electrode 8 is deposited on an entire surface including the color filter layer 7.

Meanwhile, a gate line (not shown in the drawing) and a gate electrode (not shown in the drawing) are formed by forming a first metal layer of Al or Al alloy on a second substrate and patterning the first metal layer by photolithography. A gate insulating layer is formed by stacking an inorganic insulating layer of $SiN_x$ or $SiO_x$ on the entire exposed surface, including the gate line, by sputtering.

Subsequently, a semiconductor layer is formed by depositing amorphous silicon on the gate insulating layer over the gate electrode, and a second metal layer of Cr or Mo is formed on the entire surface including the semiconductor layer. The second metal layer is then patterned by photolithography, whereby a data line, a source electrode, and a drain electrode are formed.

Thereafter, a passivation layer is formed with $SiN_x$ or $SiO_x$ on the entire surface including the data line, and a pixel electrode of ITO penetrating the passivation layer is formed just to be connected to the drain electrode.

In this case, the gate and data lines are arranged to cross with each other, whereby scan and data signals are transferred to the corresponding pixels, respectively. A thin film transistor including the gate electrode, semiconductor layer, source electrode, and drain electrode is formed at each intersection between the gate and data lines. The thin film transistor plays a role in applying a voltage to the corresponding pixel electrode or cutting off the voltage. Each of the pixel electrodes is arranged to confront the corresponding common electrode and plays a role in controlling alignment of liquid crystal molecules.

In order to form the above-mentioned elements, several photolithography processes are carried out. In this case, each of the photolithography processes includes the steps of patterning and stripping the photoresist.

Subsequently, a seal pattern is formed as an adhesive agent on a circumference of the surface of the first substrate, and a spacer is evenly dispersed on the second substrate. The first and second substrates are arranged to confront each other, and then are bonded to each other.

The bonded substrates are cut into unit cells, and then liquid crystals are injected between the two substrates of each of the unit cells through a liquid crystal injection inlet previously formed. Finally, the liquid crystal injection inlet is sealed so that the injected liquid crystals does not leak out. Thus, a liquid crystal display device is completed.

Unfortunately, the related art has the following problems or disadvantages.

First of all, when an organic based solution is used as the stripper for the photoresist, the product cost of the liquid crystal display device increases since an organic based material is expensive.

Secondly, a system for preparing for a possible fire when using the organic based solution is necessary, whereby the apparatus for fabricating the liquid crystal display device become complicated.

Thirdly, in order to overcome the problem of the organic based solution, an inorganic based stripper of KOH can be used. However, the KOH stripper reacts with the photoresist, generating a foam, and further contaminates the fabricating apparatus. Hence, a cleaning process for removing the foam is required, and the time required for conducting the cleaning process extends the overall time of fabrication.

Finally, the endurance of the filter used for reuse of the used stripper material is shortened.

SUMMARY OF THE INVENTION

Accordingly, an aspect of the present invention is directed to a method and apparatus for stripping a photoresist that substantially obviate one or more problems and disadvantages of related art.

Thus, an object of the present invention is to provide a method of stripping a photoresist which enables the removal of foam generated during the stripping process.

Another object of the present invention is to provide an apparatus for stripping a photoresist which provides for the supply of an antifoaming agent for removing foam generated from a stripping process.

A further object of the present invention is to provide an apparatus for stripping a photoresist which enables an improvement in the speed of operation of the semiconductor-relating fabricating apparatus.

In order to achieve the above objectives, an embodiment of the present invention uses an antifoaming agent in the stripping process. At least one member is provided adjacent to the stripping bath and the stripper storing unit for supplying the antifoaming agent in the fabrication of a liquid crystal display device, according to an embodiment of the present invention.

Additional advantages, objects, and features of the embodiments of the present invention will be set forth, in part, in the description which follows and, in part, will become apparent to those having ordinary skill in the art upon examination of the following or may be learned from the practice of the present invention. The objectives and other advantages may be realized and attained by the structure particularly pointed out in the written description and claims hereof as well as the appended drawings.

To achieve these objects and other advantages and in accordance with the purpose of the invention, as embodied and broadly described herein, an apparatus for removing photoresist according to an embodiment of the present invention includes a stripping bath chamber, a conveying unit conveying a substrate containing a photoresist through the stripping bath chamber, a photoresist stripper material supplying unit positioned to dissolve the photoresist stripper material to the substrate while the substrate is disposed in the stripping bath chamber, an antifoaming agent supplying unit operatively associated with the stripper bath chamber dispensing an antifoaming agent toward the photoresist stripper material in the stripping bath chamber, an antifoaming agent storing unit communicating with the antifoaming agent supplying unit supplying the antifoaming agent thereto, and a stripper storing unit connected to the stripper supplying unit supplying stored photoresist stripper material thereto.

In another aspect of the present invention, an apparatus for removing a photoresist material includes a stripping bath chamber, a conveying unit conveying a substrate containing a photoresist through the stripping bath chamber, a photoresist stripper material supplying unit positioned to dispense the photoresist stripper material to the substrate while the substrate is disposed in the stripping bath chamber, an antifoaming agent supplying unit operatively associated with the stripping bath chamber dispensing an antifoaming agent toward the photoresist stripper material in the stripping bath chamber, an antifoaming agent storing unit communicating with the antifoaming agent supplying unit supplying antifoaming agent thereto, a stripper storing unit operatively connected to the stripper supplying unit supplying stored photoresist stripper thereto, and an additional antifoaming agent supplying unit operatively associated with the stripper storing unit dispensing an antifoaming agent therein.

In a further aspect of the present invention, a method of removing a photoresist material includes providing a stripping bath chamber, conveying a substrate containing a photoresist through the stripping bath chamber, applying a photoresist stripper material to the substrate containing the photoresist, and applying an antifoaming agent to the photoresist stripper material to eliminate the foam produced therin.

It is to be understood that both the foregoing general description and the following detailed description of the present invention are exemplary and explanatory and are intended to provide further explanation of the present invention.

BRIEF DESCRIPTION OF THE DRAWINGS

The embodiments of the present invention will become more fully understood from the detailed description given hereinbelow and the accompanying drawings which are given by way of illustration only, and thus are not limitative of the present invention, and wherein.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 4:
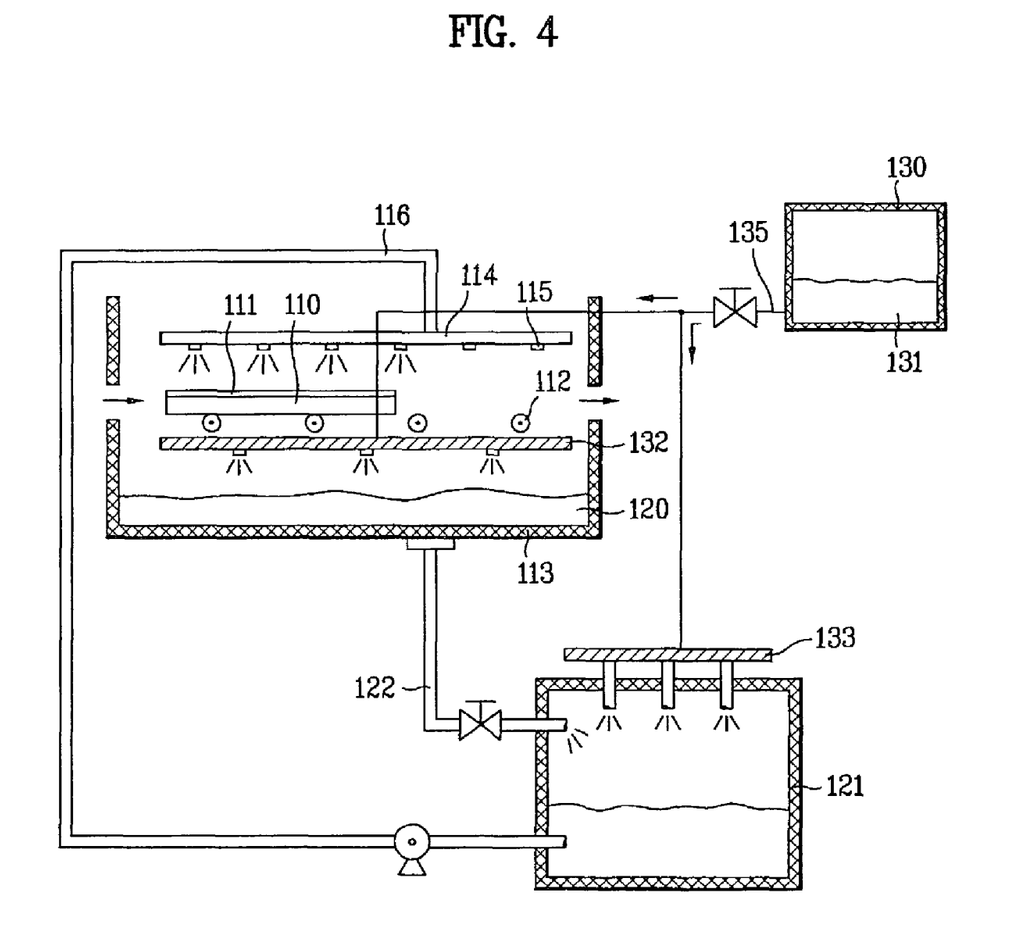
FIG. 4 illustrates a structural diagram of an apparatus for stripping photoresist according to an embodiment of the present invention.

FIG. 4 illustrates a structural diagram of an apparatus for stripping photoresist according to the present invention.

Referring to FIG. 4, an apparatus for stripping photoresist according to the present invention includes a stripping bath 113 being made of PVC (polyvinylchloride) for collecting a stripper 120 which is sprayed during the process of stripping the photoresist. A stripper supplying unit 114 containing a plurality of stripper-spraying nozzles 115 is provided together with conveying rollers 112 which are placed under the stripper supplying unit 114 to convey a substrate 110 formed with the photoresist to the inside of the bath 113 and transfer the substrate 110 to the outside of the bath 113 after the stripping of the photoresist 111. A stripper drain pipe 122 is used for discharging the stripper material 120 collected in the bath 113. A stripper storing unit 121 stores the stripper discharged through the stripper drain pipe 122. An antifoaming agent storing unit 130 is used to house an antifoaming agent and a first antifoaming agent supplying unit is installed under the conveying roller 112 to remove foam generated inside the bath 113 by spraying the antifoaming agent 131 from the antifoaming agent storing unit 130 to the collected stripper material 120. Also, an antifoaming agent supply pipe 135 connects the first antifoaming agent supplying unit 132 to the antifoaming agent storing unit 130.

In the bath 113, the stripper supplying unit 114 is placed over the conveying unit 112 and the first antifoaming agent supplying unit 132 is placed under the conveying unit 112. Hence, the substrate 110 is conveyed by the conveying unit 112 between the stripper supplying unit 114 and the first antifoaming agent supplying unit 132.

The foam is generated when the photoresist 111 formed on the substrate 110 is reacted with the stripper material 120 discharged from the stripper supplying unit 114. Hence, the first antifoaming agent supplying unit 132 is disposed below the substrate 110 in the bath 113 and is designed to spray a small quantity of the antifoaming agent 131 uniformly on the used stripper material 120 collected in the bath 113.

The stripper storing unit 121 is connected to the stripper supplying unit 114 through the stripper supplying pipe 116 to provide the stripper supplying unit 114 with the stripper material 120. Moreover, the stripper storing unit 121 is connected to the bath 113 through the stripper drain pipe 122, whereby the used stripper material 120 collected in the bath 113 can be stored in the stripper storing unit 121 for recycling.

The system for stripping photoresist of the embodiment of the present invention can include at least two stripper storing units 121 including a first stripper storing unit and a second stripper storing unit (only one stripper storing unit 121 is shown in FIG. 4, but other stripper storing unit(s) are not shown in FIG. 4), each stripper storing unit includes a stripper drain pipe 122 and a second antifoaming agent supplying unit 133. Therefore, if the efficacy of the used stripper material stored in the first stripper storing unit is reduced due to the fact that the stripper material is not able to be recycled to the stripper supplying unit 114, the used stripper material is replaced with a new stripper material stored in the second stripper storing unit, and the used stripper material stored in first stripper storing unit is drained.

As mentioned in the above description, the first antifoaming agent supplying unit 132 is installed in the bath 113, and simultaneously, a second antifoaming agent supplying unit 133 can be installed adjacent to the stripper storing unit 121 for spraying the antifoaming agent 131 into the stripper storing unit 121. Thus, the foam which is generated during the stripping process but not removed in the bath 113, can be discharged to the stripper storing unit 121 when the remaining foam included in the discharged stripper material 120 can be completely removed so that the stripper material 120 substantially free of foam can be recycled to the stripper supplying unit 114.

The second antifoaming agent supplying unit 133 is installed over the stripper storing unit 121, and is connected to the antifoaming agent storing unit 130 through the antifoaming agent supplying pipe 135.

Thus, contamination caused by the residue of the photoresist remaining in the stripper storing unit 121 can be removed, and the stripper material substantially free of foam can be reused.

As mentioned in the forgoing description, a substrate having undergone a photoresist forming process, an exposure process, a development process, and an etch process is introduced into the apparatus for stripping the photoresist. After the photoresist remaining on the substrate has been removed, the substrate is removed from the apparatus.

A process of stripping photoresist from a substrate using the apparatus for stripping the photoresist according to the present invention is explained in detail as follows.

First of all, a layer of a pattern material is formed on a substrate and a photoresist is formed on the material. The exposure process is then carried out after a pattern mask is disposed over the photoresist.

After the development process has been carried out on the exposed photoresist, either a developed or undeveloped portion of the photoresist is removed just to pattern the photoresist.

After the pattern material layer is etched using the patterned photoresist as an etch mask, the patterned photoresist is stripped.

In order to strip the patterned photoresist 111, first of all, the substrate 110 having undergone the etch process is transferred to the inside of the bath 113 of the stripping unit by the conveying roller 112 shown in FIG. 4. In this case, the stripper material 120 is sprayed from the stripper supplying unit 114 disposed over the transferred substrate 110, toward the substrate 110, whereby the photoresist 111 is stripped from the substrate 110.

The embodiment of the present invention can use an inorganic based KOH or NaOH material as the stripper material 120. The KOH stripper material includes 4±0.05% KOH and 96±1% deionized water. The KOH stripper material enables the stripping process to be carried out at room temperature as well as the cleaning of the substrate with water after the stripping process.

Meanwhile, the photoresist 111 stripped from the substrate 110 is reacted with the KOH stripper material 120 to produce the above-mentioned foam in the bath 113. The foam is produced since the resin as a component of the photoresist functions as a surfactant to form micells centering around the air when the KOH stripper material 120 is sprayed from the stripper supplying unit 114.

Specifically, the photoresist 111 is a polymeric material mixed with an organic solvent, a resin, a photo-reactive compound, and a surfactant. The organic solvent is 100% PGMEA which has the characteristic of removing the foam as well as the property of low viscosity. Hence, the foam cannot be stably produced.

The photo-reactive compound has both hydrophilic and hydrophobic properties, but exhibits a low viscosity. The photo-reactive compound occupies a small content in the photoresist 111 and thus has less influence on the generation of the foam.

Also, even if the surfactant is the most sensitive factor in the generation of foam, the content of the surfactant is very small in ppm and is diluted by the photoresist stripper material 120. Hence, the surfactant has a small influence on the generation of the foam.

On the contrary, the resin as a main component of the photoresist 111 has a high viscosity as well as hydrophilic and lipophilic properties in its molecules. Moreover, the resin occupies about 80% of the photoresist 111, thereby becoming a major material in the generation of the foam. Thus, the resin functions as a surfactant to form the micells centering around the air layer when the KOH stripper material 120 is sprayed.

The foam contaminates the stripping apparatus as well as extending the time required for cleaning the substrate 110, thereby decreasing the operational efficiency of the apparatus for fabricating liquid crystal display devices. In the present embodiment, the antifoaming agent 131 is added in a small quantity through the antifoaming agent supplying units 132 and 133 for removing the foam from the collected stripper material 120.

The antifoaming agent 131 is mingled with the foam to break the foam. Hence, the hydrophobic property of the antifoaming agent 131 should be stronger than the hydrophilic property. The antifoaming agent 131 should be dissolved well in water after the removal of the foam. The antifoaming agent 131 is a material having a strong performance toward removing the foam when sprayed on the foam, but loses such a performance thereafter.

Alcohol groups satisfy the above-explained conditions. Specifically, methanol, ethanol, and propanol are strongly hydrophobic. However, the rest of the alcohol groups from butanol fail to mingle with water, thereby making them unusable.

It is more preferable that IPA (isopropyl alcohol) or alcohol groups having IPA added thereto is used as the antifoaming agent.

The antifoaming agent does not have significant influence on the stripping capability of the stripper below 5% of the stripper supply. Hence, if the quantity of the antifoaming agent 131 is smaller than or equal to 5% of the amount of stripper material 120, the stripper material 120, which is mingled with the antifoaming agent 131 in the bath 113 and drained to the stripper storing unit 121, can be reused.

Meanwhile, even though the antifoaming agent 131 and KOH stripper material 120 differ in chemical properties from each other, it can be confirmed that the phase fails to be separated during the stripping process and no additional product is produced.

As mentioned in the forgoing description, if the photoresist 111 coated on the substrate 110 is removed and the foam is removed by the antifoaming agent 131, the stripper material 120 collected in the bath 113 is drained to the stripper storing unit 121 through the stripper drain pipe 122. The stripper material 120 transferred to the stripper storing unit 121 is recycled to the stripper supplying unit 114 for reuse.

As mentioned in the foregoing description, the residue of the photoresist remaining on the substrates is washed by water in a cleaning device. Such a water cleaning is possible since the KOH stripper, which is an inorganic material, is used as the photoresist stripper.

The stripping apparatus according to the present invention can be applied to other fabricating processes of semiconductor devices, plasma display panel devices, e.g., and the like, as well as liquid crystal display devices.

Although one embodiment according to the present invention uses a KOH as the photoresist stripper, the same stripping apparatus shown in FIG. 4 can be applied to the case where NaOH is used as the stripper material.

The method and apparatus for stripping a photoresist according to the various embodiments of the present invention have the following advantages or effects.

First of all, the stripping apparatus according to the present embodiment includes the additional antifoaming agent supplying unit, thereby enabling the removal of the foam generated from the reaction between the photoresist and the photoresist stripper in the stripping process. Thus, the present invention minimizes the contamination of the stripping apparatus due to the formation of foam as well as reduces the cleaning time of the substrate.

Secondly, the apparatus removes the foam in the stripping bath, thereby minimizing an error of the stripping apparatus due to the foam.

Finally, the apparatus removes the remaining foam in the stripper storing unit, thereby enabling to lengthen the endurance of the filter used for the reuse of the stripper.

It will be apparent to those skilled in the art that various modifications and variations can be made in the present invention. Thus, it is intended that the present invention covers the modifications and variations of the present invention provided they come within the scope of the appended claims and their equivalents.

What is claimed is:

1. An apparatus for removing a photoresist from a substrate comprising:
    a conveying unit conveying the substrate;
    a stripping bath chamber;
    a stripper dispensing unit positioned to dispense a photoresist stripper material to the substrate while the substrate is disposed in the stripping bath chamber;
    a first antifoaming agent dispensing unit operatively associated with the stripping bath chamber, the first antifoaming agent dispensing unit configured to dispense an antifoaming agent toward the photoresist stripper material in the stripping bath chamber;
    an antifoaming agent storing unit communicating with the first antifoaming agent supplying unit, the antifoaming agent storing unit configured to store the antifoaming agent;
    a stripper storing unit operatively connected to the stripper dispensing unit, the stripper storing unit configured to store the photoresist stripper material and configured to supply the stored photoresist stripper material to the stripper dispensing unit; and
    a second antifoaming agent dispensing unit operatively associated with the stripper storing unit, the second antifoaming agent dispensing unit configured to dispense an antifoaming agent to the photoresist stripper material stored within the stripper storing unit;
    a stripper drain pipe that connects directly between the stripper storing unit and the stripping bath chamber to drain the photoresist stripper material from the stripping bath chamber to the stripper storing unit;
    a stripper supplying pipe that connects directly between the stripper dispensing unit and the stripper storing unit to supply the photoresist stripper material from the stripper storing unit to the stripper dispensing unit;
    a first antifoaming agent supplying pipe that connects directly between the antifoaming agent storing unit and the antifoaming agent dispensing unit to supply the antifoaming agent from the antifoaming agent storing unit to the first antifoaming agent dispensing unit; and
    a second antifoaming agent supplying pipe that connects directly between the antifoaming agent storing unit and the second antifoaming agent dispensing unit to supply the antifoaming agent from the antifoaming agent storing unit to the second antifoaming agent dispensing unit,
    wherein the antifoaming agent storing unit is configured to supply the antifoaming agent to the first and second antifoaming agent dispensing units, and
    wherein a quantity of the antifoaming agent is no more than 5% of a quantity of the photoresist stripper material.

2. The apparatus of claim 1, wherein each of the first and second antifoaming agent dispensing units, and the stripper dispensing unit has at least one nozzle.

3. The apparatus of claim 1,
    wherein the first antifoaming agent dispensing unit comprises a plurality of antifoaming agent dispensing nozzles, and
    wherein the first antifoaming agent dispensing is disposed entirely within the stripping bath chamber.

4. The apparatus of claim 1, wherein the stripper storing unit is a first stripper storing unit, the apparatus further comprising:
    a second stripper storing unit operatively connected to the stripper dispensing unit and to the stripping bath chamber,
    wherein the second stripper storing unit is configured to store the photoresist stripper material drained from the stripping bath chamber and configured to supply the stored photoresist stripper material to the stripper dispensing unit.

5. The apparatus of claim 4, further comprising:
    a third antifoaming agent dispensing unit operatively connected to the antifoaming agent storing unit,
    wherein the third antifoaming agent dispensing unit is configured to dispense the antifoaming agent from antifoaming agent storing unit to the photoresist stripping material stored in the second stripper storing unit.

6. The apparatus of claim 1, wherein the first antifoaming agent dispensing unit is configured to dispense additional antifoaming agent to the photoresist stripper material in the stripping bath chamber that has been dispensed by the stripper dispensing unit.

7. The apparatus of claim 1, wherein the first antifoaming agent dispensing unit is configured to dispense additional antifoaming agent to a recycled photoresist stripper material from the stripper storing unit dispensed by the stripper dispensing unit.

8. The apparatus of claim 1, wherein the second antifoaming agent dispensing unit is configured to dispense additional antifoaming agent to the photoresist stripper material in the stripper storing unit that has been drained from the stripping bath chamber.

9. The apparatus of claim 1, wherein the antifoaming agent dispensing unit is configured to dispense additional antifoaming agent to the photoresist stripper material in the stripper storing unit prior to being recycled by the stripper dispensing unit.

10. A method for removing a photoresist from a substrate, comprising;
    providing a stripping bath chamber;
    conveying a substrate containing a photoresist through the stripping bath chamber;
    applying a photoresist stripper material to the substrate containing the photoresist; and
    applying a first antifoaming agent to the photoresist stripper material in the stripping bath chamber to eliminate the foam produced therein, wherein a quantity of the antifoaming agent is no more than 5% of a quantity of the photoresist stripper material;

draining the photoresist stripper material collected in the stripping bath chamber after use in a stripping process to a stripper storing unit for reuse; and applying a second antifoaming agent directly to the photoresist stripper material stored in the stripper storing unit to remove the foam remaining in the photoresist stripper material stored in the stripper storing unit.

11. The method of claim 10, wherein the photoresist stripper material is an inorganic based material.

12. The method of claim 11, wherein the inorganic based material is selected from the group consisting of KOH and NaOH.

13. The method of claim 10, further comprising supplying the photoresist stripper material from the stripper storing unit to be dispensed to the substrate being conveyed through the stripping bath chamber.

14. The apparatus of claim 10, wherein the antifoaming agent includes alcohol groups.

15. The method of claim 10, wherein the antifoaming agent is isopropyl alcohol.

16. The method of claim 10, wherein the antifoaming agent is one of methanol, ethanol, and propanol.

17. The method of claim 10, wherein the stripper storing unit is a first storing unit, the method further comprising:

determining whether the photoresist stripper material in the first stripper storing unit is unable to be reused;

draining the photoresist stripper material collected in the stripping bath chamber after use in the stripping process to a second stripper storing unit for reuse when it is determined that the photoresist stripper material in the first stripper storing unit is unable to be reused; and applying the antifoaming agent to the photoresist stripper material to remove the foam remaining in the photoresist stripper material stored in the second stripper storing unit.

18. The method of claim 17, the method further comprising:

draining the photoresist stripper material from the first stripper storing unit when it is determined that the photoresist stripper material in the first stripper storing unit is unable to be reused.

19. The method of claim 10, wherein the step of applying the first antifoaming agent to the photoresist stripper material includes applying additional antifoaming agent to the photoresist stripper material in the stripping bath chamber that has been used in the step of applying the photoresist stripper material to the substrate containing the photoresist.

* * * * *